(12) United States Patent
Patrascu et al.

(10) Patent No.: US 7,457,167 B2
(45) Date of Patent: Nov. 25, 2008

(54) METHOD FOR PREVENTING OVER-ERASING OF UNUSED COLUMN REDUNDANT MEMORY CELLS IN A FLASH MEMORY HAVING SINGLE-TRANSISTOR MEMORY CELLS

(75) Inventors: Dinu Patrascu, Sunnyvale, CA (US); On-Pong Roderick Ho, Milpitas, CA (US); Wei-Yen Kuo, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 201 days.

(21) Appl. No.: 11/553,393

(22) Filed: Oct. 26, 2006

(65) Prior Publication Data
US 2008/0101118 A1    May 1, 2008

(51) Int. Cl.
G11C 11/34    (2006.01)
(52) U.S. Cl. .................. 365/185.3; 365/185.09
(58) Field of Classification Search .......... 365/185.3, 365/185.09, 185.22
See application file for complete search history.

(56) References Cited

U.S. PATENT DOCUMENTS

| 5,237,535 A | 8/1993 | Mielke et al. | |
| 5,327,383 A * | 7/1994 | Merchant et al. | 365/185.24 |
| 6,404,680 B1 * | 6/2002 | Kwon | 365/185.3 |
| 6,407,944 B1 * | 6/2002 | Choi et al. | 365/185.09 |
| 6,940,781 B2 | 9/2005 | Seitoh | |

* cited by examiner

*Primary Examiner*—Anh Phung
(74) *Attorney, Agent, or Firm*—Schwegman, Lundberg & Woessner, P.A.

(57) ABSTRACT

A method is provided for testing and for preventing over-erasure of unused redundant memory cells that can be subsequently used to replace defective memory cells in a Flash memory. An unused redundant memory cell is preprogrammed and tested simultaneously with each group of n memory cells. The selected unused redundant memory cell is preprogrammed only a couple of times and then skipped for the rest of the preprogramming pulses applied to the regular core cells. Each unused redundant memory cells is selected g times, where g is the ratio between the number of regular core cells and the number of redundant core cells in a row. As soon as an unused redundant memory cell is successfully preprogrammed, further preprogramming of that unused redundant memory cell is stopped until all regular cells in the group are preprogrammed. An unused redundant memory cell remains available as a replacement cell until chip testing is completed. After all of the chip testing is completed, whatever redundant memory cells are to be used are fused into place so that the rest of the unused redundant cells are no longer needed.

10 Claims, 2 Drawing Sheets

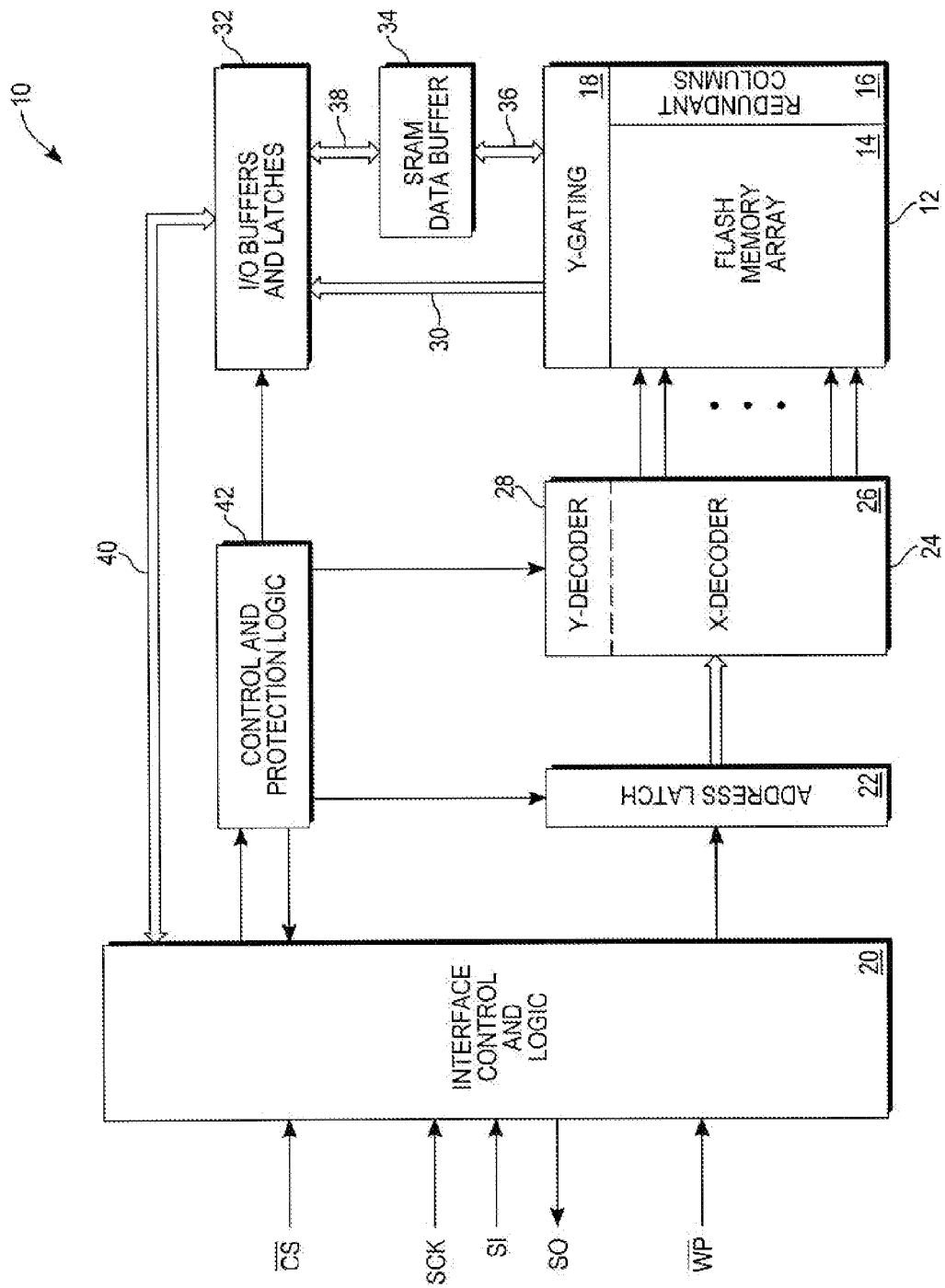
Fig._1

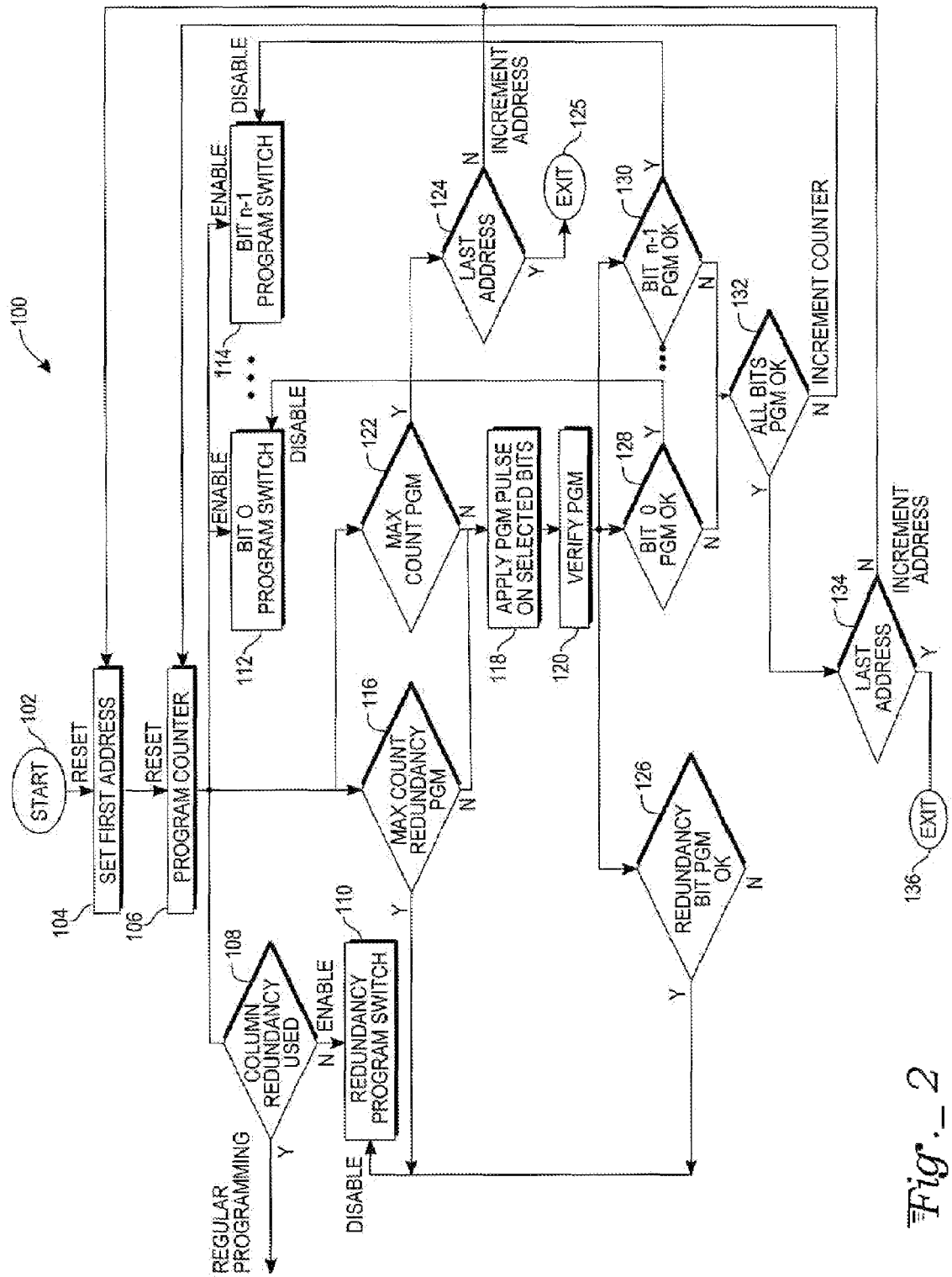
Fig._2

US 7,457,167 B2

METHOD FOR PREVENTING OVER-ERASING OF UNUSED COLUMN REDUNDANT MEMORY CELLS IN A FLASH MEMORY HAVING SINGLE-TRANSISTOR MEMORY CELLS

TECHNICAL FIELD

The present invention relates to a Flash memory and, more particularly, to prevention of over-erasure of unused column redundant cells in a Flash memory that uses a single transistor for each memory cell.

BACKGROUND ART

A common problem of single-transistor FLASH memory designs is the so-called "over-erase" problem. An over-erased Flash memory cell is a Flash memory cell that has a very low threshold voltage $V_t$ which is so low that, when that over-erased memory cell is accessed, the floating gate of that over-erased memory cell cannot be programmed to have a high enough $V_t$ threshold voltage that it can be turned OFF to provide a logical output 0.

Conventional single-cell flash memory cells are programmed and erased using a procedure in which each memory bit cell is iteratively programmed and erased with a program/erase pulse in a short period of time and then verified. These two programming and verification steps are repeated until each memory cell has an acceptable $V_t$ level.

In order to improve overall yield for a flash memory chip design, redundant columns are added to the chip to be available to replace a few defective bits in the chip and thereby transform a "bad" flash-memory chip with a few defective bits into a usable chip. During normal backend production testing, the regular memory cells of each block of a Flash memory device are cycled through a few erase cycles, including the corresponding preprogramming cycles, to verify proper operation of the regular memory cells of the Flash memory device. Only regular memory cells and those particular redundant cells that are currently being used to replace defective regular memory cells are preprogrammed, whereas unused redundant bits do not get preprogrammed. However, the same unused column redundant cells are erased together with regular cells in the bock being erased. Thus, during the course of backend testing, over-erased unused redundant bits that have not been preprogrammed can be present and those over-erased redundant memory cells can be subsequently used to replace defective regular memory cells. It is often difficult to recover a redundant memory cell from an over-erasure condition. Having erroneous data in redundant memory cells defeats the purpose for adding redundant columns to a Flash memory design.

One way of avoiding over-erasure in unused redundant cells is to add an additional preprogramming step in the backend testing that separately programs only unused redundant cells in a separate testing cycle. However, this approach is expensive because it adds more backend testing time. Additionally, a test program is needed to keep track of how many times each block has been erased and the unused redundant cell has been pulsed with a preprogramming pulse.

In conventional Flash memory designs, the column redundant granularity, or ratio of regular memory cells to column redundant cells is g:1. This means that each column redundant cell can replace only one of a certain set of g regular memory cells. Whenever one of the g regular memory cells is selected it will point to the same column redundant cell.

SUMMARY OF THE INVENTION

The present invention provides a method for preventing over-erasure of an unused redundant memory cell that provides redundant operation for a group of n regular memory cells in a Flash memory having single transistor memory cells. The method comprises the steps of: preprogramming the n regular memory cells for a MAX COUNT PGM predetermined number of times or until a $V_t$ voltage threshold for each of the n regular memory cells is within a $V_t$ specification range and simultaneously preprogramming the unused redundant memory cell for a MAX COUNT REDUNDANCY PGM predetermined number of times or until the $V_t$ voltage threshold for the unused redundant memory cells is within the $V_t$ specification range.

The present invention provides a method for preventing over-erasing of unused redundant memory cells in a Flash memory having single-transistor memory cells, comprising the steps of: (a) resetting an address counter to a first address inside the predetermined block; (b) resetting a preprogram pulse counter that counts preprogram pulses for a selected group of n regular memory cells in the Flash memory; (c) enabling each of n respective regular memory programming switches of n memory cells; (d) if a particular redundant memory cell that is assigned to replace on regular memory cell in the group of n memory cells is currently not being used for replacement of a defective one of the n memory cells, enabling a redundant memory cell programming switch; (e) applying respective preprogramming pulses through the enabled regular programming switches to the current group of n regular memory cells in the selected row; (f) simultaneously applying preprogramming pulses to the redundant memory cell through the enabled redundant memory cell programming switch; (g) verifying $V_t$ threshold voltage levels for each of the n regular memory cells; (h) for those ones of the n memory cells that are within a predetermined $V_t$ threshold voltage specification, disabling their respective preprogramming switches; (i) verifying $V_t$ threshold voltage level on the enabled redundant memory cell; (j) if the $V_t$ voltage level for the enabled redundant memory cell is within a predetermined $V_t$ specification, disabling the redundant memory cell switch; (k) if the $V_t$ voltage level is not in specification, incrementing the preprogram pulse counter and repeating steps (e) through (k) until a MAX COUNT REDUNDANCY PGM predetermined maximum number of preprogramming pulses are applied to the currently unused redundant memory cell and until a MAX COUNT PGM predetermined maximum number of preprogramming pulses are applied to remaining ones of the n memory cells of the selected group of n memory cells; and (l) after all of the $V_t$ voltage levels are within a $V_t$ specification for the current group of n regular memory cells, regardless of the $V_t$ voltage level of the redundant cell, setting the address counter to the next address and repeating steps (b) through (l) for all of the addresses in the predetermined block of the flash memory.

BRIEF DESCRIPTION OF THE DRAWINGS

The accompanying drawings, which are incorporated in and form a part of this specification, illustrate embodiments of the invention, and together with the description, serve to explain the principles of the invention:

FIG. 1 is a block diagram of an exemplary embodiment of a serial Flash memory.

FIG. 2 is a flow chart that shows operation of a test procedure for preventing over-erasure of unused column redundant memory cells.

DETAILED DESCRIPTION

Briefly, the invention is a method of testing and preventing for over-erasure of unused column redundant memory cells that may be used to replace defective memory cells in a Flash memory. Regular memory cells or already used column redundant memory cells are tested in the usual way. Conventionally, currently unused column redundant memory cells have been skipped with regard to the preprogramming step so that their over-erase condition is unknown. Subsequent use of an over-erased column redundant cell results in a permanent "On" state for an over-erased redundant cell.

In order to reduce testing time for currently unused column redundant memory cells, the present invention preprograms unused column redundant memory cells during the same step in which the regular memory cells are preprogrammed. In the present invention, and unused column redundant memory cell that is assigned to replace one cell in a group of n regular memory cells is selected for testing and preprogramming along with the group of n regular memory cells under preprogramming. The selected unused column redundant memory cell is preprogrammed only a couple of times and then skipped for the rest of the programming pulses. As soon as the unused column redundant memory cell is successfully preprogrammed, verification logic stops further programming of that unused column redundant memory cell and the preprogrammed unused column redundant memory cell returns to a standby status and remains available for use as a column redundant bit until chip testing is completed. After all of the chip testing is completed, whatever column redundant memory cells are to be used are fused into place so that the rest of the unused column redundant cells are no longer needed.

FIG. 1 illustrates an exemplary embodiment of a serial Flash memory device 10 for which a test procedure is provided for preventing over-erasure of unused column redundant memory cells. A Flash memory 12 includes a flash memory array 14 having redundant columns 16 of redundant memory cells along with y-gating circuits 18. An interface control and logic subsystem 20 receives an inverted chip select signal on a $\overline{CS}$ pin, a serial clock signal on a SCK, and an inverted write protect signal on a $\overline{WP}$ pin. A serial input signal on a IS pin is used to serially shift data into the device and for all data input including command and address sequences. A serial output signal on a SO pin is used to serially shift data out from the device.

An over-erased memory cell provides a current greater than the current expected from a minimal $V_t$ threshold voltage. Repair of an over-erased memory cell is obtained by iteratively applying a programming pulse to the over-erased cell and testing whether the over-erase condition still exists.

Memory addresses from the interface control and logic subsystem 20 are latched into an address latch circuit 22 and presented to an address decoder circuit 24 that has an x-decoder circuit 26 that provides x, or row, addresses to the flash memory array 14. The address decoder circuit 24 also has a y-decoder circuit 28 that provides y column addresses to the y-gating circuits 18 of the flash memory 12.

Output column data is provided from the y-gating circuits 18 on a bus 30 to I/O buffers and latches circuits 32. A SRAM data buffer circuit 34 is connected with a bi-directional bus 36 to the y-gating circuits 18. The SRAM data buffer circuit 34 is also connected through a bidirectional bus 38 to the I/O buffers and latches circuits 32. A bus 40 connects the interface control and logic subsystem 20 to the I/O buffers and latches circuits 32.

A control and protection logic circuit 42 provides signals that control operation of the serial Flash memory 10 including read, write, and erase functions. The control and protection logic circuit 42 exchanges signals with the interface control and logic subsystems 20. The control and protection logic circuit 42 also sends signals to the address latch circuit 22, the address decoder circuit 24, and the I/O buffers and latch circuits 32.

The serial Flash memory device 10 uses, in one embodiment, a Serial Peripheral Interface (SPI) and is controlled by a set of commands, or instructions, that are sent from a host that is commonly referred to as a Serial Peripheral Interface (SPI) Master. The SPI Master (not shown) communicates with the serial Flash memory 10 via a SPI bus that includes four signal lines for Chip Select ($\overline{CS}$), Serial Clock (SCK), Serial Input (SI), and Serial Output (SO). In one embodiment, a valid instruction, or opcode, starts by first asserting the Chip Select ($\overline{CS}$) pin. Then, the SPI Master clocks out a valid 8-bit opcode on the SPI bus. Following the opcode, instruction dependent information such as address and data bytes are then clocked out by the SPI Master.

Opcodes are provided for several types of commands, including Read commands, Program and Erase commands, Protection commands, Status Register commands, and Miscellaneous commands. A program command permits anything from a single byte of data to a number of bytes of data to be programmed into previously erased memory locations. In general, an erased memory block has all memory bits set to a logical "1" state (all "1"s or FFh).

FIG. 2 is a flow chart 100 that illustrates an exemplary embodiment of a method, or test procedure, for preventing over-erase of presently unused column redundant single-transistor memory cells for a Flash memory. A start block indicates resetting of an address register to a starting preprogramming address, as indicated by a Set First Address block 104. The start block 102 also indicates resetting of a program counter 106 that keeps track of the number of preprogramming pulses applied to the group of n regular memory cells undergoing preprogramming.

A decision block 108 indicates that the test procedure determines if a column redundant memory cell for the current address is already being used as a substitute for a defective regular memory cell. If so, the already used redundant bit is preprogrammed by regular preprogramming of the memory cells at the selected address. If the redundant memory cells is not being used in a substitute capacity, a Redundancy Program Switch block 110 indicates that a programming switch for the unused column redundant bit is enabled. The enabled programming switch allows the floating gate of the unused redundant memory bit to be programmed with preprogramming pulses, if necessary.

The test procedure also enables program switches, as indicated by blocks 112, 114 for preprogramming Bits 0 through n-1 of the regular memory cells for the selected address.

A MAX COUNT REDUNDANCY PGM decision block 116 indicates testing the program counter to determine whether a maximum number, such as MAX COUNT REDUNDANCY, for example, of programming pulses have been applied to the unused redundant cell. If the maximum number MAX COUNT REDUNDANCY of pulses have been applied, the control logic deselects (disables) the column redundancy program switch to stop programming of that unused redundant cell, even if the $V_t$ specification for the redundant cell have not been reached.

Similarly, a MAX COUNT PGM decision block 122 indicates that the program counter is tested to determine whether a maximum number of programming pulses for the regular memory cells have been used. If a maximum count of preprogramming pules for the regular memory cells is reached, this indicates that one or more of the regular memory cells are defective because they cannot be preprogrammed to reach the predetermined $V_t$. In this case, the test procedure as indicated by a LAST ADDRESS decision block 124, determines if the memory cells at the last address of the memory cells have been tested. If not, the address is incremented. If the memory cells at the last address have been tested, the test procedure stops as indicated by an EXIT block 125. If the maximum count of preprogramming pulses for the regular memory cells is not reached, a function block 118 indicates that a preprogramming pulse is applied to all selected bits, including the unused redundant bit, if still selected. A VERIFY PGM block 120 indicates that the $V_t$ voltage level is verified for all cells under preprogramming.

After the $V_t$ verification step of block 120 for the unused redundant memory cell, the test procedure method proceeds, as indicated by a REDUNDANCY BIT PGM OK decision block 126, to determine if the $V_t$ level for the unused redundant memory cell is within a specification range. If yes, the test procedure disables the redundancy program switch for the redundant memory cell. Similarly, after the $V_t$ verification step, as indicated by block 120, for regular memory cells 0 to n-1, the test procedure proceeds to n decision points that are represented by the BIT 0 PGM OK block through the BIT n-1 PGM OK decision blocks 128, 130. If the $V_t$ level for one or more bits of the current group of n regular memory cells is within limits, the test procedure disables the corresponding program switch(es). An ALL BITS PGM OK decision block 132 indicates testing for whether the $V_t$ level(s) for any of the group of n regular memory cells is not within limits. If one or more bits of the group of n regular memory cells are not within the $V_t$ limits, the program counter is incremented to run through another cycle of applying a preprogramming pulse and verification of $V_t$ levels as indicated by the No output of decision block 132.

If the $V_t$ level for all regular memory cells is OK, that is, within limits, the test procedure goes, as indicated by a LAST ADDRESS decision block 134, to monitor the address register. If the last address of the regular memory cells is not being tested, the address is incremented to continue the $V_t$ testing for the next address of the memory. If the last address has been tested, the test procedure stops, as indicated by an EXIT block 136.

In summary, the decision block 108 determines that a redundant cell that is already being used to replace a defective regular memory cell is handled through a standard regular preprogramming test procedure. The decision block 116 sets the maximum number of preprogramming pulses MAX COUNT REDUNDANCY that are applied to an unused redundant memory cell for a given address. Similarly the decision block 122 sets the maximum number of preprogramming pulses that are applied to any of the regular memory cells.

The unused redundant bit switch is turned off after MAX COUNT REDUNDANCY PGM is reached, so that the bits of the regular group of n memory cells can continue to be programmed with no extra loading of the bit charge pump even if any of the unused redundant cells are found to be defective.

As soon as it is successfully programmed, the internal verify logic will stop applying extra programming pulses to the redundant cell. Every unused redundant cell is selected g times during a preprogramming cycle, where g is the granularity of the column redundancy, the ratio between the number of regular core cells and the number of redundant cells. If the redundant cells cannot be programmed, no fail condition occurs. If a redundant memory cell is already in use, it is preprogrammed through the regular procedure.

In one embodiment, the preprogramming of unused redundant cell is necessary only until a previously unused redundant memory cell is fused into the memory device to function in place of a defective regular memory cell. In one embodiment, the test procedure is active only in test mode. For ordinary operations of the Flash memory, this test procedure method is disabled. In one embodiment, the test procedure for currently unused redundant bit operates in parallel at the same time as preprogramming of regular memory cells and works with all types of erase commands. A significant benefit is that this method increases chip yield, making unused column redundant cells functional until they are fused as a replacement element.

The foregoing description of a specific embodiment of the present invention has been presented for purposes of illustration and description. It is not intended to be exhaustive or to limit the invention to the precise forms disclosed, and obviously many modification and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for preventing over-erasure of an unused redundant memory cell provided for a group of n regular memory cells in a Flash memory having single-transistor memory cells, the method comprising the steps of:

preprogramming the n regular memory cells for a MAX COUNT PGM predetermined number of times or until a $V_t$ voltage threshold for each of the n regular memory cells is within a $V_t$ specification range; and simultaneously preprogramming the unused redundant memory cell for a MAX COUNT REDUNDANCY PGM predetermined number of times or until the $V_t$ voltage threshold for the unused redundant memory cell is within a $V_t$ specification range.

2. The method of claim 1 further comprising the steps of:

enabling each of n respective regular memory programming switches that are provided for preprogramming each one of the n regular memory cells in the group; and if a particular redundant memory cell assigned to replace any of the n regular memory cells being preprogrammed is not being used for replacement of a defective one of the n memory cells in the group, enabling a redundant memory cell programming switch for simultaneous preprogramming of that particular redundant memory cell with the n regular memory cells.

3. The method of claim 1, including the steps of:

verifying $V_t$ threshold voltage levels for each of the memory cells of the group of n memory cells; and for those one of the n memory cells that are within the $V_t$ specification range, disabling their respective preprogramming switches.

4. The method of claim 1, including the steps of:

verifying a $V_t$ threshold voltage level on the enabled redundancy cell; and if the $V_t$ voltage level for the unused redundant memory cell is within the $V_t$ specification range, disabling the redundancy preprogramming switch.

5. The method of claim 1, including the steps of:

incrementing a preprogram pulse counter and preprogramming the group of n regular memory cells up to the MAX COUNT PGM predetermined number of times or until each of their $V_t$ voltage thresholds are within the Vt specification range; and simultaneously preprogramming the unused redundant memory cell up to a MAX COUNT REDUNDANCY PGM predetermined number of times or until the $V_t$ voltage threshold of the unused redundant memory cell is within the $V_t$ specification range.

6. The method of claim 1, including the step of:
if the number of preprogramming pulses for a group of n memory cells exceeds a predetermined number, providing another group of n regular memory cells for preprogramming.

7. The method of claim 1, including the step of disabling the redundancy programming switch if the number of preprogramming pulses for a currently selected unused redundant memory cell exceeds the predetermined number.

8. A method for preventing over-erasing of unused redundancy memory cells in a predetermined block of a Flash memory having single-transistor memory cells, comprising the steps of:
   (a) resetting an address counter to a first address of the block under preprogramming;
   (b) resetting a preprogram pulse counter that counts preprogram pulses for a selected group of n regular memory cells in the flash memory;
   (c) enabling each of n respective regular memory programming switches that are provided for preprogramming of each one of the n memory cells in the selected group;
   (d) if a particular redundant memory cell that is assigned to the selected group of n memory cells is currently not being used for replacement of a defective one of the n memory cells in the selected group, enabling a redundant memory cell programming switch;
   (e) applying respective preprogramming pulses through the regular memory programming switches to the current group of n regular memory cells in the selected row;
   (f) simultaneously applying preprogramming pulses through the enabled redundant memory cell programming switch to the redundant memory cell;
   (g) verifying $V_t$ threshold voltage levels for each of the n memory cells;
   (h) for those ones of the n memory cells that are within a predetermined $v_t$ specification range, disabling their respective preprogramming switches;
   (i) verifying $V_t$ threshold voltage level on the enabled redundant memory cell;
   (j) if the $V_t$ voltage level for the enabled redundant memory cell is within a predetermined $V_t$ specification range, disabling the redundant memory cell programming switch;
   (k) incrementing the preprogram pulse counter and repeating steps (e) through (k) until a MAX COUNT REDUNDANCY PGM predetermined maximum number of preprogramming pulses are applied to the currently unused redundant memory cell and until a MAX COUNT PGM predetermined maximum number of preprogramming pulses are applied to remaining ones of the n memory cells of the selected group of n memory cells; and
   (l) after all of $V_t$ voltage levels are within specification for the selected group of n regular memory cells regardless of the $V_t$ voltage level of the unused redundant memory cell, setting the address counter to a next address and repeating steps (b) through (k) for all of the addresses in the predetermined block of the Flash memory.

9. The method of claim 8 including, if the number of preprogramming pulses for the selected group of n memory cells exceeds a MAX COUNT PGM predetermined number, providing another group of n memory cells, and exiting the test procedure after a last group of n memory cells is preprogrammed.

10. The method of claim 8 including, if the number of preprogramming pulses for the currently unused redundant memory cells exceeds a MAX COUNT REDUNDANCY PGM predetermined number, disabling the redundancy programming switch.

* * * * *

UNITED STATES PATENT AND TRADEMARK OFFICE
CERTIFICATE OF CORRECTION

| | |
|---|---|
| PATENT NO. | : 7,457,167 B2 |
| APPLICATION NO. | : 11/553393 |
| DATED | : November 25, 2008 |
| INVENTOR(S) | : Patrascu et al. |

It is certified that error appears in the above-identified patent and that said Letters Patent is hereby corrected as shown below:

In the Drawings.
On Sheet 2 of 2, in Fig. 2 (Box 112), line 1, delete "BIT O" and insert -- BIT 0 --, therefor.

In column 1, line 45, delete "bock" and insert -- block --, therefor.

In column 2, line 14, delete "cells" and insert -- cell --, therefor.

In column 2, line 24, after "switches" insert -- that are provided for preprogramming of the current group --.

In column 2, line 25, delete "on" and insert -- one --, therefor.

In column 2, line 61, delete "invention, and" and insert -- invention and, --, therefor.

In column 3, line 17, delete "and" and insert -- an --, therefor.

In column 3, line 42, delete "IS" and insert -- SI --, therefor.

In column 4, line 3, delete "subsystems" and insert -- subsystem --, therefor.

In column 4, line 43, delete "cells" and insert -- cell --, therefor.

In column 4, line 67, delete "pules" and insert -- pulses --, therefor.

In column 5, line 65, delete "cells" and insert -- cell --, therefor.

In column 6, line 8, delete "bit" and insert -- bits --, therefor.

In column 6, line 18, delete "modification" and insert -- modifications --, therefor.

UNITED STATES PATENT AND TRADEMARK OFFICE
CERTIFICATE OF CORRECTION

PATENT NO. : 7,457,167 B2
APPLICATION NO. : 11/553393
DATED : November 25, 2008
INVENTOR(S) : Patrascu et al.

It is certified that error appears in the above-identified patent and that said Letters Patent is hereby corrected as shown below:

In column 6, line 56, in Claim 3, delete "one" and insert -- ones --, therefor.

In column 7, line 2, in Claim 5, delete "Vt" and insert -- $V_t$ --, therefor.

In column 8, line 4, in Claim 8, delete "$v_t$" and insert -- $V_t$ --, therefor.

Signed and Sealed this

Twenty-fourth Day of February, 2009

JOHN DOLL
*Acting Director of the United States Patent and Trademark Office*